US010161999B1

(12) United States Patent
Nand et al.

(10) Patent No.: US 10,161,999 B1
(45) Date of Patent: Dec. 25, 2018

(54) CONFIGURABLE SYSTEM AND METHOD FOR DEBUGGING A CIRCUIT

(71) Applicant: Xilinx, Inc., San Jose, CA (US)

(72) Inventors: Heera Nand, Alwar (IN); Niloy Roy, Hyderabad (IN); Mahesh Sankroj, Secunderabad (IN); Siddharth Rele, Navi Mumbai (IN); Riyas Noorudeen Remla, Singapore (SG); Rajesh Bansal, Singapore (SG); Bradley K. Fross, Boulder, CO (US)

(73) Assignee: XILINX, INC., San Jose, CA (US)

( * ) Notice: Subject to any disclaimer, the term of this patent is extended or adjusted under 35 U.S.C. 154(b) by 221 days.

(21) Appl. No.: 15/091,376

(22) Filed: Apr. 5, 2016

(51) Int. Cl.
*G06F 17/50* (2006.01)
*G01R 31/317* (2006.01)
*G01R 31/3177* (2006.01)

(52) U.S. Cl.
CPC ... *G01R 31/31703* (2013.01); *G01R 31/3177* (2013.01); *G06F 17/5045* (2013.01); *G06F 17/5068* (2013.01); *G06F 17/5081* (2013.01)

(58) Field of Classification Search
None
See application file for complete search history.

(56) References Cited

U.S. PATENT DOCUMENTS

| | | | | |
|---|---|---|---|---|
| 5,920,711 A * | 7/1999 | Seawright | ........... | G06F 17/5045 703/15 |
| 6,396,517 B1 * | 5/2002 | Beck | ....................... | G01R 13/32 702/117 |
| 6,760,898 B1 * | 7/2004 | Sanchez | ............. | G01R 31/3177 716/111 |
| 7,356,786 B2 * | 4/2008 | Schubert | .......... | G01R 31/31705 716/106 |
| 7,536,615 B1 * | 5/2009 | Pierce | ................ | G01R 31/3177 326/37 |
| 7,743,296 B1 * | 6/2010 | Pierce | ................. | G06F 17/5027 326/37 |
| 7,882,465 B2 * | 2/2011 | Li | ................... | G01R 31/318519 326/38 |
| 8,099,271 B2 * | 1/2012 | Schubert | .......... | G01R 31/31704 703/16 |
| 8,769,357 B1 * | 7/2014 | Weintraub | ..... | G01R 31/318519 714/725 |
| 8,875,039 B2 * | 10/2014 | McLernon | ................ | G06F 8/34 715/771 |
| 8,943,448 B2 * | 1/2015 | Alfieri | ................... | G06F 17/505 716/101 |

(Continued)

*Primary Examiner* — Leigh M Garbowski
(74) *Attorney, Agent, or Firm* — LeRoy D. Maunu; Kevin Cuenot

(57) ABSTRACT

Approaches for capturing states of signals of a circuit-under-test are disclosed. A logic analyzer circuit is coupled to the circuit-under-test and is configured to receive a plurality of probe signals and a plurality of trigger signals from the circuit-under-test. The logic analyzer circuit inputs data identifying a subset of the probe signals and a subset of the trigger signals. The logic analyzer circuit selects the subset of trigger signals for input to trigger logic and selects the subset of probe signals in the logic analyzer circuit after the logic analyzer circuit and the circuit-under-test are active. The logic analyzer circuit samples states of the subset of probe signals in response to the trigger logic and stores the sampled states of the subset of probe signals in a memory.

20 Claims, 6 Drawing Sheets

(56) References Cited

U.S. PATENT DOCUMENTS

| | | | |
|---|---|---|---|
| 8,983,790 B1 | 3/2015 | Merugu et al. | |
| 9,244,810 B2* | 1/2016 | Alfieri | G06F 11/362 |
| 9,489,283 B1* | 11/2016 | Popovici | G06F 11/3636 |
| 2010/0100860 A1* | 4/2010 | Chang | G06F 17/5027 |
| | | | 716/111 |

* cited by examiner

Legend: mx(y)
m : data/message from circuit under test
x : bit location of m
y : clock cycle count after trigger assertion

US 10,161,999 B1

CONFIGURABLE SYSTEM AND METHOD FOR DEBUGGING A CIRCUIT

TECHNICAL FIELD

The disclosure generally relates to systems that support debugging a circuit.

BACKGROUND

In-circuit emulators and logic analyzers are often used with programmable logic devices in testing and debugging circuits. Testing and debugging generally entails running the circuit, applying input stimuli, and checking the states of selected signals in the circuit.

In one approach, a programmable integrated circuit includes programmable logic and interconnect resources that are configured to implement the circuit-under-test and a logic analyzer circuit. The logic analyzer circuit receives signals from the circuit-under-test. The signals include trigger signals and data signals. The trigger signals are used to control the initiation of sampling of states of the data signals. The states of the data signals may be logged into the on-chip memory of the programmable integrated circuit. The sampled data may then be sent to a host computer system via a boundary scan interface that is connected to the on-chip memory. Software executing on the host computer system displays the sampled data and provides a mechanism to adjust the trigger and probe data selection via the boundary scan interface.

SUMMARY

According to one method of and systems for capturing states of signals of a circuit-under-test are disclosed, a logic analyzer circuit is coupled to the circuit-under-test and receives a plurality of probe signals and a plurality of trigger signals from the circuit-under-test. The logic analyzer circuit inputs data identifying a subset of the probe signals and a subset of the trigger signals. The logic analyzer circuit selects the subset of trigger signals for input to trigger logic and selects the subset of probe signals in the logic analyzer circuit after the logic analyzer circuit and the circuit-under-test are active. The logic analyzer circuit samples states of the subset of probe signals in response to the trigger logic and stores the sampled states of the subset of probe signals in a memory.

Another method of capturing states of signals of a circuit includes inputting to a processor, first data that identifies a first plurality and a second plurality of signals of a circuit description. The signals of the first plurality are selectable for probing and signals of the second plurality are selectable to be trigger signals. A first circuit is generated from the circuit description and the first data, and a second circuit is generated from the first data and coupled to the first circuit. Second data is input from a user interface to the second circuit. The second data indicates a first subset of signals of the first plurality to probe, specifies trigger logic, and indicates one or more signals of the second plurality of signals to be the trigger signals. The first and second circuits are activated, and the second circuit selects the one or more signals of the second plurality for input to the trigger logic and selects the first subset of signals of the first plurality. The second circuit samples states of the first subset of signals of the first plurality in response to the trigger logic and stores the sampled states of the first subset of signals of the first plurality in a memory.

A disclosed system for capturing states of signals of a circuit-under-test includes a processor configured to execute a debugger program, wherein execution of the debugger program causes the processor to input first data indicating a subset of probe signals to capture from the circuit-under-test and output a data selection signal indicative of the subset of probe signals. A logic analyzer circuit is coupled to the circuit-under-test and to the processor. The logic analyzer circuit includes a first selector circuit coupled to input the probe signals from the circuit-under-test. The first selector circuit is configured and arranged to select the subset of probe signals in response to the data selection signal. The logic analyzer circuit further includes a trigger circuit that is coupled to receive a trigger signals from the circuit-under-test. The trigger circuit is configured and arranged to enable sampling states of the subset of probe signals in response to the trigger signals. A memory is coupled to input sampled states of the subset of probe signals from the first selector circuit.

Other features will be recognized from consideration of the Detailed Description and Claims, which follow.

BRIEF DESCRIPTION OF THE DRAWINGS

Various aspects and features of the disclosed methods and systems will become apparent upon review of the following detailed description and upon reference to the drawings in which.

DETAILED DESCRIPTION

Figure 1:
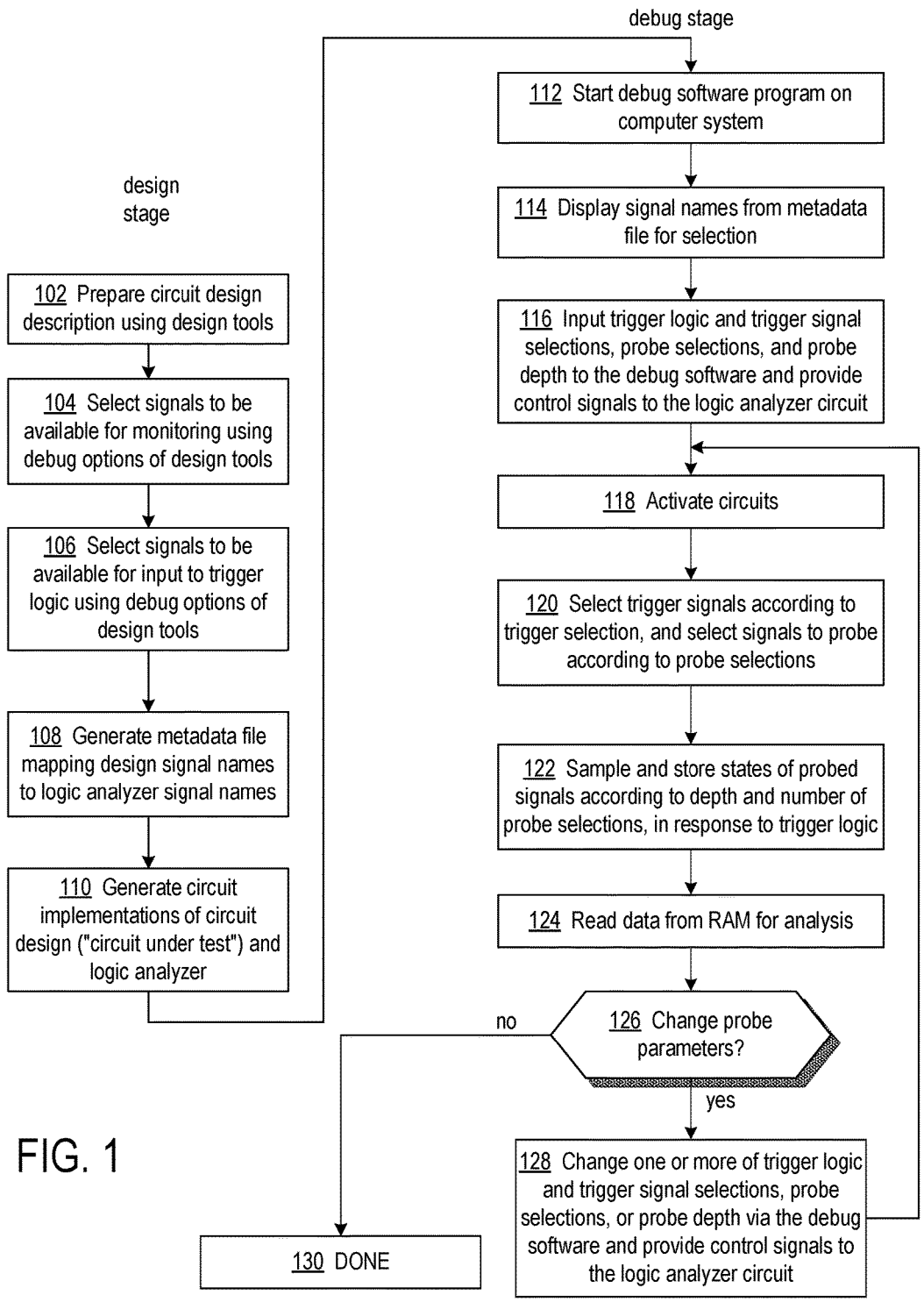
FIG. 1 shows a process of preparing a circuit design and debugging the circuit design according to some implementations.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Logic analyzers often use on-chip memory resources to store the sampled states of desired signals. However, on-chip memory is a limited resource and thereby restricts the number of signals whose states can be monitored and the number of cycles for which the signals may be probed. Limits on the number of signals that can be probed and the number of cycles for which the signals may be probed may impede debugging a design and ultimately delay releasing a final product.

Often while debugging a design, the designer may want to change the signals that are probed and/or change the number of cycles for which the probed signals are sampled. The current signals being probed may not provide enough information for the designer to identify the source of an error, or the number of samples of the probed signals (also, "probe depth" or "sample depth") may fall short of the number of samples needed to diagnose a problem in the design. A challenge faced by the designer is that the probed signals and number of samples may be fixed for an implemented design. The signals probed and the probe depth are selected prior to implementing a circuit from the design and are fixed while the circuit-under-test is operating. In order to change the probed signals or probe depth, the designer may be forced to modify and re-implement the circuit design, which may require a large amount of the designer's time. Making the desired modification may entail changing the circuit design specification, synthesizing the circuit design specification, mapping, placing, and routing the synthesized design, and generating configuration data for implementing a circuit that functions according to the design on a programmable integrated circuit. Re-implementing the design with additional memory to store a few more cycles of probe signal(s) may affect the timing of the circuit-under-test and create further problems in testing.

The disclosed methods and systems provide approaches for dynamically changing the signals of a circuit design that are probed and the probe depth of the sample signals. The process is dynamic in that the circuit design under test need not be modified and re-implemented in order to change the probed signals and/or probe depth. Rather, a designer may input data indicating different probed signals and/or a different probe depth to debugger software executing on a computer system, and the new parameters may be scanned-in to a logic analyzer circuit that is coupled to the circuit-under-test. In response to the newly scanned-in parameters, the logic analyzer selects the designated signals from the available signals of the circuit-under-test and remaps on-chip memory to accommodate the probe depth. The remapping of memory resources provides sample depths that may range from a shallow sample depth for a greater number of probed signals to a deep sample depth for fewer probed signals.

In one implementation, during the design phase the circuit design that is to undergo debugging is adapted by the designer to provide to a logic analyzer circuit, signals that are eligible to be probed and signals that are eligible to be used as trigger signals. A circuit-under-test is generated from the circuit design along with a logic analyzer circuit that is coupled to input the signals that are eligible to be probed or be trigger signals from the circuit-under-test. The generated circuits may be implemented on a programmable IC, for example.

The logic analyzer circuit interfaces with debugger software executing on a computer system, and the executing debugger software provides to a designer functions for selecting a subset of the eligible signals to probe. The debugger software also provides to the designer functions for specifying trigger conditions based on a designated subset of the signals eligible to be trigger signals. Once the signals to be probed and the trigger condition are specified and communicated to the logic analyzer circuit, the circuit-under-test and logic analyzer circuit are activated in response to user interaction with the debugger software. The logic analyzer circuit selects the specified trigger signals and selects the specified subset of signals of the circuit-under-test for probing. If the trigger condition is satisfied by the states of the selected trigger signals, the logic analyzer circuit commences sampling and storing states of the selected subset of signals.

In some implementations, the designer can change the selection of the signals to be probed and also specify and/or change a sample depth in order gather the desired information. For example, if the available on-chip memory has been exhausted for storing sampled signal states and a greater sample depth would be helpful, the designer may reduce the number of signals probed and increase the sample depth via the debugger software. The new parameter values are provided to the logic analyzer circuit, and when the circuit-under-test begins operating and the trigger condition is satisfied, the logic analyzer circuit selects the newly designated signals for sampling and maps the sampled signal states according to the number of signals sampled and the sample depth.

FIG. 1 shows a process of preparing a circuit design and debugging the circuit design according to some implementations. The process may be viewed as including a design stage and a debug stage. During the design stage, the circuit design is prepared and adapted for debugging, and during the debugging stage, the implemented circuit-under-test is operated and signals selected and states sampled according to the parameters specified by the designer.

At block 102, the designer prepares a circuit design using customary electronic design automation (EDA) tools. In preparing the circuit design, an analysis function of the EDA tools inputs data specified by the designer. The specified data indicates those signals of the circuit design that are to be eligible to be probed during the debug stage at block 104. A subset of the probe-eligible signals is selectable to be probed once the circuit has been implemented on a target device. In one implementation, the analysis function displays signals of the circuit design organized by clock domain along with a single, user-selectable control element for selecting or deselecting all the signals of the circuit design to be eligible for probing.

At block 106, the analysis function of the EDA tools inputs from the designer, data that specifies signals of the circuit design that are to be eligible to be trigger signals during the debug stage. A subset of the trigger-eligible signals is selectable by the designer to be used as trigger signals once the circuit has been implemented on the target device.

The analysis function of the EDA tools generates, at block 108, a metadata file that maps signal names of the circuit design to signal names to be used by the debugger tool in interfacing with the logic analyzer circuit. The metadata file may be generated by traversing the database generated from synthesis of the circuit design and storing the circuit design signal names in the metadata file. The metadata file contains the signal names as specified in the circuit design, mapped to signal names used by the logic analyzer circuit, along with the source and destination information. The metadata file may also include an interface level mapping for signals that belong to an interface. At debug time, the metadata file can be read by the debugger tool, and the debugger tool can show the circuit design signal names to assist the designer in selecting the subset of signals of the probe-eligible signals and the subset of the trigger-eligible signals.

At block 110, the EDA tools generate circuit implementations of the circuit design and the logic analyzer circuit. The implementation of the circuit design may be referred to as the "circuit-under-test." In generating the circuit-under-test and logic analyzer circuit, in some implementations the EDA tools generate configuration data for configuring a programmable IC and configure the programmable IC with the configuration data. The logic analyzer circuit is coupled to the circuit-under-test and inputs the probe-eligible and trigger-eligible signals. In some implementations, multiple, respective logic analyzer circuits may be generated and coupled to different clock domains of the circuit-under-test.

The debug stage commences at block 112, at which a debugger program begins execution on a computer system that is coupled to the circuit-under-test. The debugger program may communicate with the logic analyzer circuit via a boundary scan interface, for example. It will be appreciated that various alternative computing arrangements, including one or more processors and a memory arrangement configured with program code, would be suitable for hosting the debugger program. The computer code, which implements the debugger program and is executable by a computer processor, may be stored and provided via a variety of computer-readable storage media or delivery channels such as magnetic or optical disks or tapes, electronic storage devices, or as application services over a network. At block 114, the debugger program reads the metadata file and displays the names of signals of the circuit design for user selection.

At block 116, the debugger program inputs from the designer, data that specifies trigger logic and indicates a subset of the probe-eligible signals. The trigger logic identifies one or more of the trigger-eligible signals as trigger signals and a Boolean expression involving the states of the trigger signals, for example. In addition to specifying the trigger logic and the signals to probe, the data input by the debugger program specifies a probe depth. The probe-depth indicates the number of samples to capture for each of the probed signals. The debugger program provides the user interface for the designer to enter the desired data, uses the mapped information from the metadata file to determine identifiers of corresponding signals used by the logic analyzer circuit, and communicates signals indicative of the second data to the logic analyzer circuit.

The circuit-under-test and logic analyzer circuit are activated and operated at block 118. Activation and operation of the circuits entails applying a clock signal and inputting data signals to the circuit-under-test. The clock signal is also applied to the sampling portion(s) of the logic analyzer circuit.

At block 120, the logic analyzer circuit selects the trigger signals according to the trigger selection data provided by the debugger program and selects the signals to probe according to the probe selection data. At block 122, the logic analyzer circuit samples and stores states of the probed signals in response to the trigger logic. That is, if the states of trigger signals satisfy the condition checked by the trigger logic, the sampled states of the signals are stored in on-chip memory. According to some implementations, the sampling and storing may continue until the number of stored samples is equal to the specified probe depth.

The logic analyzer circuit uses the probe depth and number of signals probed to map the sampled states of the probed signals to respective locations in the on-chip memory. In some implementations, the sampled states are stored in contiguous bit locations in the on-chip memory.

At block 124, the debugger program reads the stored sampled states using customary functions of the debugger program. In rendering waveforms for display on a display screen, the debugger program uses the probe depth and number of probed signals to determine the bits read from the on-chip memory that are associated with each probed signal.

At decision block 126, the designer indicates to the debugger program whether or not the probe parameters are to be changed to continue debugging. If so, the process continues at block 128, at which one or more of the probe parameters may be changed. Specifically, the debugger software may input from the designer, different trigger logic and trigger signal selections, different signals to probe, and/or a different probe depth. In response to the changed parameter values, the debugger software outputs signals to the logic analyzer circuit to indicate the new operating parameters. As shown by the operations of blocks 118-128, the probe parameters may be changed without having to repeat the design stage operations (102-110) involving generating of the circuit-under-test and connecting desired signals to the logic analyzer circuit. The process returns to block 118 and repeats the operations with the new operating parameters. If debugging is not to continue with changed probe parameters, the process completes at block 130.

Figure 2:
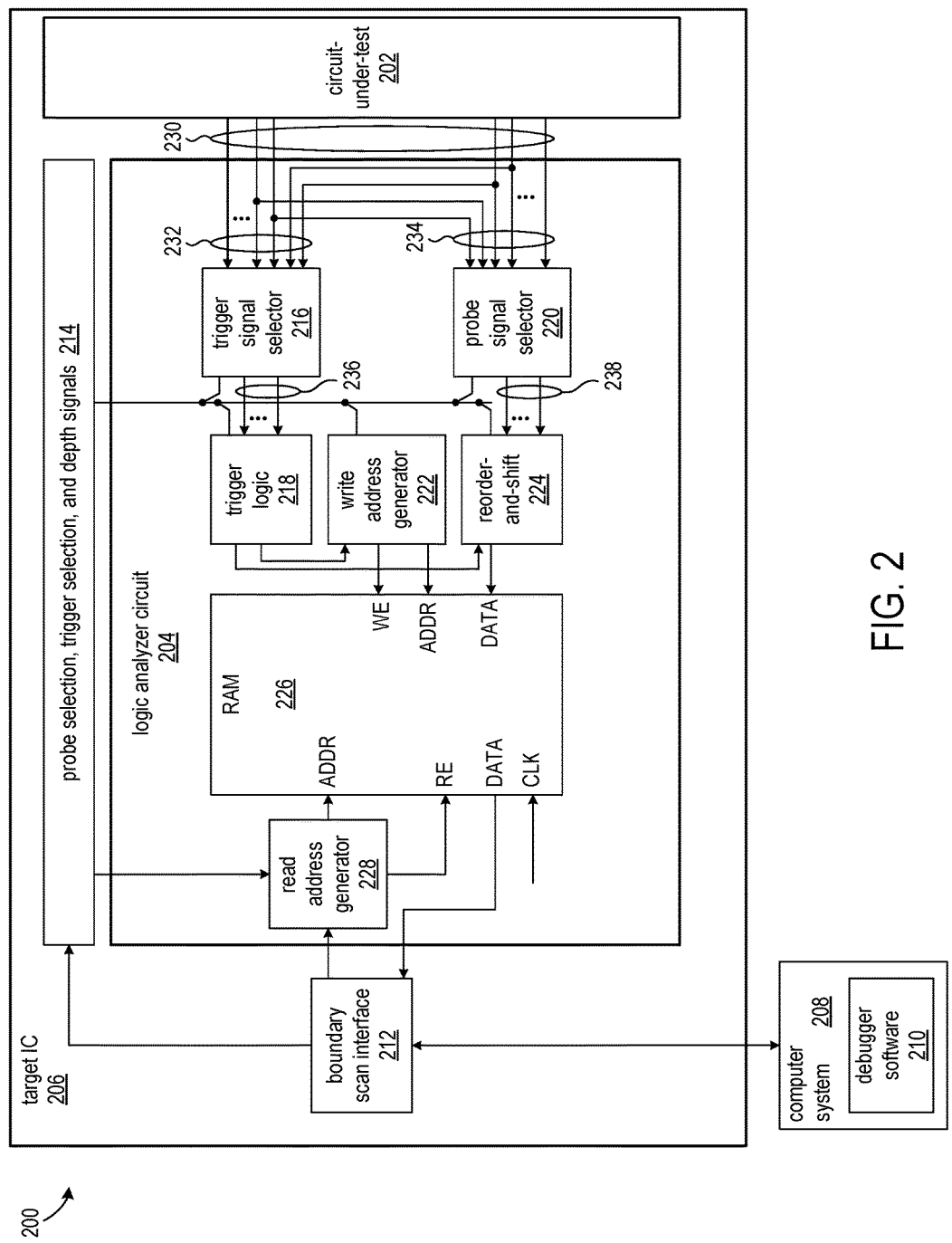
FIG. 2 shows a circuit diagram of a system in which a circuit-under-test is probed by a logic analyzer circuit.

FIG. 2 shows a circuit diagram of a system 200 in which a circuit-under-test 202 is probed by a logic analyzer circuit 204. The system generally includes a target IC 206, such as a programmable IC that is communicatively coupled to a computer system 208. The circuit-under-test 202 and the logic analyzer circuit 204 are implemented on the target IC, and a debugger program 210 executes on the computer system 208 and controls the debug scenario in response to user inputs. The debugger program provides a user interface for input of data to control the sampling and communicates with the logic analyzer circuit via boundary scan interface circuitry 212, through which signals 214 are applied to the logic analyzer circuit to select the signals to probe, specify trigger logic and a trigger selection signal(s), and specify the probe depth.

The logic analyzer circuit includes circuitry for sampling probed signals, circuitry for storing the sampled states of the probed signals, and circuitry for reading the sampled and stored states of the probed signals. The circuitry for sampling the probed signals generally includes trigger signal selector 216, trigger logic 218, probe signal selector 220, write address generator 222, and reorder-and-shift circuit 224. Sampled states of the probed signals are stored in RAM 226, and read address generator 228 reads the stored sampled states in response to requests from the debugger program 210.

The signals 230 of the circuit-under-test 202 that are connected for input to the logic analyzer circuit 204 include the trigger-eligible and probe-eligible signals described above. The trigger-eligible signals include signals 232, and the probe-eligible signals include signals 234. The trigger signal selector 216 and trigger logic circuitry 218 are configured in response to scanned signals provided from the debugger program via the boundary scan interface 212. The trigger signal selector selects a subset of the trigger-eligible signals 232 to be provided as trigger signals 236 input to the trigger logic. The trigger logic, which may be implemented in programmable logic circuitry, is configured to evaluate the states of the trigger signals 236 and determine whether or not the configured trigger condition is satisfied.

The probe signal selector selects a subset of the probe-eligible signals 234 to be input as the probe signal(s) 238 to the reorder-and-shift circuit 224 (also referenced as "data ordering circuit") in response to selection signals provided by the debugger program via the boundary scan interface. The reorder-and-shift circuit receives the probed signals, samples the state(s) of the selected signal(s), and assembles the sampled states into contiguous bits for storage in the RAM 226. The reordering and shifting is dependent on the word size of RAM 226 and on which signals of the probe-eligible signals 234 are selected as probe signals 238.

Figure 6:
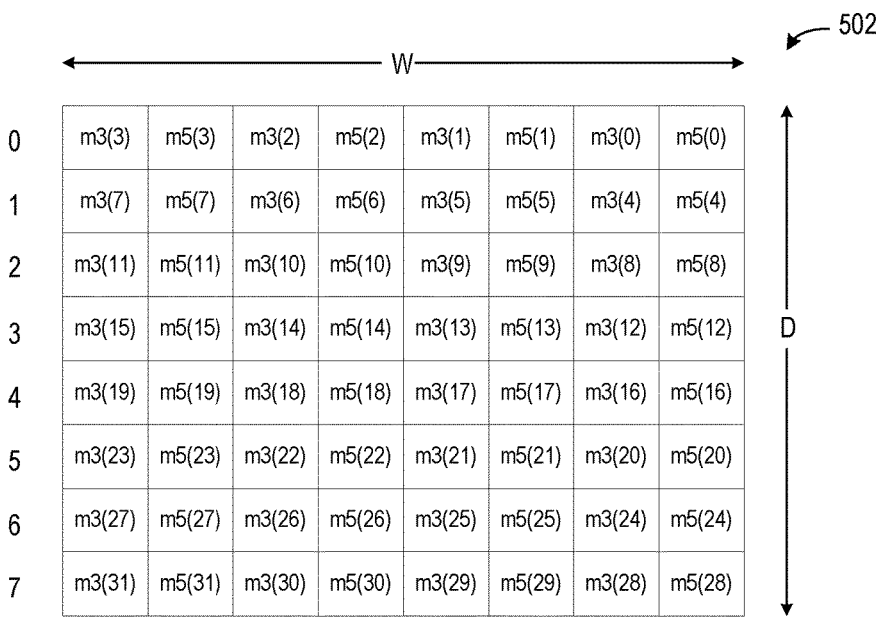
FIG. 6 shows an example memory in which 2 signals (m3 and m5) are probed for 32 samples and the sampled states are stored in the same 64-bit memory as in the example of FIG. 5.
Figure 7:
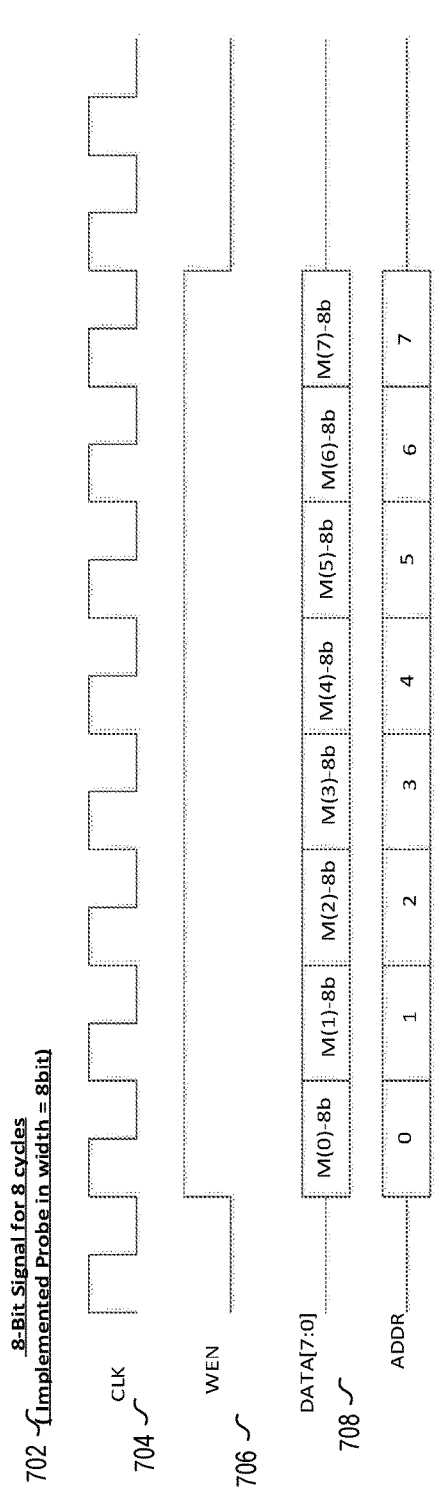
FIG. 7 shows a timing diagram that illustrates the operation of the system of FIG. 2 for the example of FIG. 5.
Figure 8:
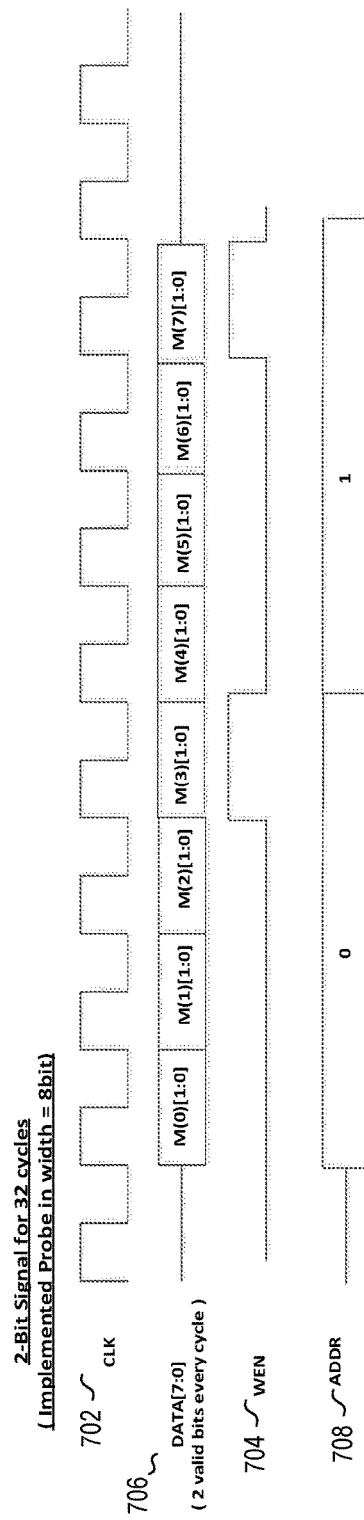
FIG. 8 shows a timing diagram that illustrates the operation of the system of FIG. 2 for the example of FIG. 6.

If the trigger condition is satisfied by the selected trigger signals 236, the trigger logic signals the write address generator 222 to activate the write-enable signal to the RAM 226. Trigger logic 218 signals reorder-and-shift circuit 224 to start operation, and based on the configuration information 214 indicating the probe selection, reorder-and-shift circuit 224 combines slices of data over multiple cycles and writes the captured data to RAM 226. For example, if the probe-eligible signals include signals m[7:0], and the probe selection signals 214 indicate the user selected signals m[3] and m[5], the reorder-and-shift circuit 224 combines the sampled states of signals m[3] and m[5] into full words for storage, as shown in FIG. 6. Write enable and data signals are generated based on the configuration information as shown in FIGS. 7 and 8. The reorder-and-shift circuit 224 together with the write address generator effectively map the states of the sampled signals to respective bit locations in the RAM 226.

The write address generator counts the number of sampled states of the probed signal(s) and deactivates the write enable signal to the RAM once the probe depth has been reached. The debugger program 210 outputs a probe depth signal indicating the probe depth to the write address generator via the boundary scan interface 212.

The read address generator 228 reads the stored, sampled states of the probe signals in response to a request from the debugger program 210 made via the boundary scan interface 212. The read address generator generates the addresses at which the sampled states are stored, provides the addresses as input to the RAM 226, and activates the read enable signal to the RAM 226. The data read from the RAM 226 is returned to the debugger program via the boundary scan interface. After reading the sampled states of the probed signals and displaying waveforms, the user may operate the debugger program to input data indicating different signals to probe, different trigger logic, and/or a different probe depth. The debugger program communicates signals indicating the changed parameters to the logic analyzer circuit as described above.

Figure 3:
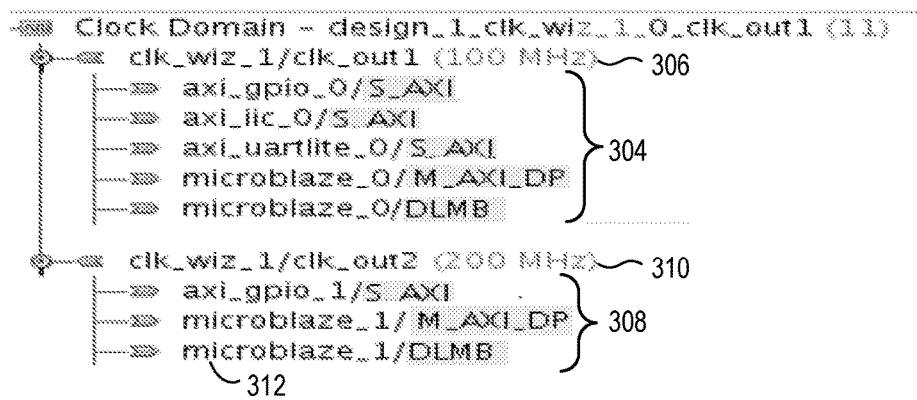
FIG. 3 shows a user interface for selection of signals of a circuit design to be eligible for probing.

FIG. 3 shows a user interface indicating signals of a circuit design to be eligible for probing. The user interface displays a list of user-selected signals based on user-selected clock domains. For example, FIG. 3 shows all the user-selected signals under two clock domains clk_wiz_1/clk_out1 and clk_wiz_1/clk_out2. Signals 304 are part of clock domain 306, and signals 308 are part of clock domain 310. In an example implementation, signals may be selected from a design canvas (not shown) in which the signal connections of the circuit design are presented, and added to the list of signals selected to be eligible for probing. For example, the signal name microblaze_1/DLMB 312 is displayed in user interface 302 in response to the user adding the signal from clock domain clk_wiz_1/clk_out2 in the design canvas.

The global control elements 314 and 316 provide the user with the ability to add all of the signals to be probe-eligible or to remove all of the signals from being probe-eligible. Selection of the Add-all control element 314 causes all of the design signals to be added into interface view. The user interface will auto identify the clock domain for each signal and add each signal into the identified clock domain. Selection of the Remove-all control element 316 removes all the user selected signals from interface view. The single-click solution allows a naïve user to enable debugging and probing of all signals in the design.

The Enable/Disable debug control element 318 provides the user with the ability to enable or disable debugging of the circuit. If debugging is enabled, then the user-selected signals will be connected to logic analyzer circuit 204, and the user can select and probe signals while running the circuit-under-test 202. When the user selects the Disable Debug feature, the circuit will be generated from the design, and a login analyzer circuit will not be generated.

The selection of the probe-eligible signals may be made during the design stage as described above. The user interface 302 may include a computer display, user input device such as a mouse, keyboard or touchpad, a memory, and a processor that executes program code for displaying data and inputting user-entered data.

Figure 4:
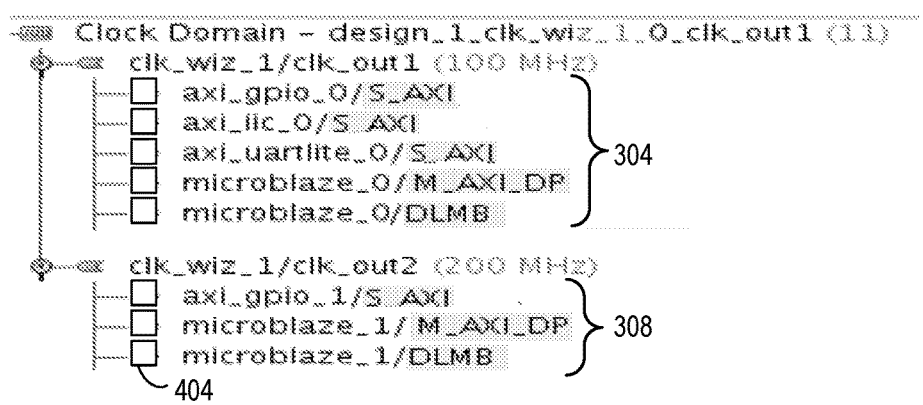
FIG. 4 shows a user interface for selection of a subset of probe-eligible signals of a circuit design for probing.

FIG. 4 shows a user interface for selection of a subset of probe-eligible signals of a circuit design for probing. The selection of the signals to probe may be made during the debugging stage as described above. The user interface 402 displays a list of names that identify the probe-eligible signals, which were added via user interface 302. The signal names may be displayed hierarchically by clock domain as shown. In the example of FIG. 4, all of the signals identified in FIG. 3 were selected to be eligible to probe.

The user interface displays control elements that are selectable by way of user input. Respective control elements are displayed proximate the names of the signal with which the control elements are associated. For example, control element 404 is displayed proximate signal name microblaze_1/DLMB and the user may select the signal as a signal to be probed by clicking near the control element or signal name.

The global control elements 406 and 408 provide the user with the ability to select all of the probe-eligible signals to be probed or to deselect all of the probe-eligible signals. Selection of the select-all control element 406 causes all of the signals 304 and 308 to be selected for probing, with the selection indicated by marked boxes of the control elements (e.g., 312). Selection of the deselect-all control element 408 clears the selection of all the signals, which may clear the marked boxes of the control elements.

Figure 5:
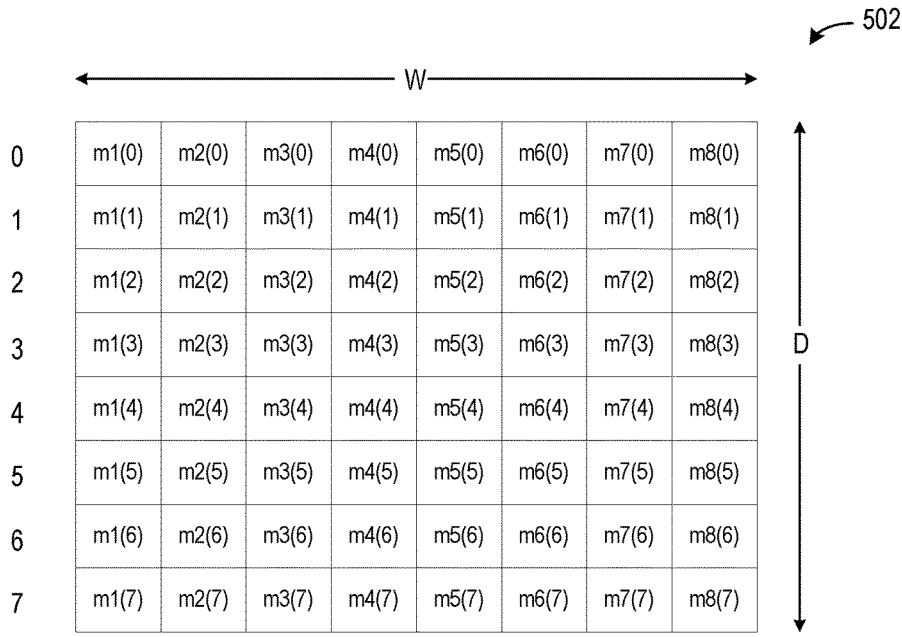
FIG. 5 shows an example memory in which 8 signals (m1-m8) are probed for 8 samples.

FIGS. 5 and 6 show examples in which the stored states of the sampled signals are stored in contiguous memory locations. The reorder-and-shift circuit 224 (FIG. 2) maps the sampled states to memory locations according to the number of signals probed (i.e., the cardinality of the subset of signals of the circuit design that are probed) and probe depth. By changing the number of signals probed, the probe depth may be increased to capture more samples while using the same memory and without having to re-implement the circuit design or logic analyzer circuit.

FIG. 5 shows an example memory 502 in which 8 signals (m1-m8) are probed for 8 samples. "Samples" refers to the number of samples of each of the probed signals and does not refer to the total number of samples of all the probed signals. A probe depth of 8 samples produces the samples shown in memory 502. The sampled state of the signal is identified by mX(Y), where X identifies a probed signal (1-8 in the example) and Y is the sample number (0-7 in the example). The memory is 8 bits wide (W) and 8 bits deep (D) in the example, providing 64 bits for storing states of sampled signals. As there are 8 signals to probe and 64 bits available for storing sampled signal states, the probe depth is limited to 8 samples. The reorder-and-shift circuit 224 accumulates the number of sampled states of m1-m8 that would occupy a word of the memory, for example, 8, and writes the accumulated set of sampled states to a word in the memory. For example, sampled states m1(0)-m8(0) are accumulated and written to contiguous bits of a word of the memory as shown. The next sampled states, m1(1)-m8(1), are written to the next contiguous word of the memory.

The disclosed methods and systems allow a user to increase the probe depth without re-implementing the circuit-under-test or the logic analyzer circuit, while using the same 64-bit memory to store the sampled states of the probed signals. The number of signals probed may be decreased, allowing for a greater number of samples, and the reorder-and-shift circuit 224 maps the signals to contiguous bit locations in the memory according to the number of signals sampled and the probe depth.

FIG. 6 shows memory 502 in which 2 signals (m3 and m5) are probed for 32 samples and the sampled states are stored in the same 64-bit memory as in the example of FIG. 5. The reorder-and-shift circuit 224 accumulates the number of sampled states of m3 and m5 that would occupy a word of the memory (i.e., 4 sampled states of m3 and 4 sampled states of m5), and writes the accumulated set of sampled states to a word in the memory. For example, sampled states m3(0), m5(0), m3(1), m5(1), m3(2), m5(2), m3(3), and m5(3) are accumulated and written to contiguous bits of a word of the memory as shown. The next sampled states, m3(4), m5(4), m3(5), m5(5), m3(6), m5(6), m3(7), and m5(7), are written to the next contiguous word of the memory.

FIGS. 7 and 8 are timing diagrams that illustrate the operation of the system of FIG. 2 for the examples of FIGS. 5 and 6, respectively.

FIG. 7 shows a timing diagram that illustrates the operation of the system of FIG. 2 for the example of FIG. 5. The CLK signal 702, write enable signal 704, data signal 706, and address signal 708 are applied to the memory 226 (FIG. 2). The write enable signal is active until all 8 samples have been written to the memory. One word/8 bits of sampled states are written to the memory in each clock cycle. Bits labeled M(0)-8b represent the sampled states m3(0), m5(0), m3(1), m5(1), m3(2), m5(2), m3(3), and m5(3) shown in FIG. 5, and are written to the memory at address 0.

FIG. 8 shows a timing diagram that illustrates the operation of the system of FIG. 2 for the example of FIG. 6. Bits labeled M(0)[1:0] represent the sampled states m3(0) and m5(0), bits labeled M(1)[1:0] represent the sampled states m3(1) and m5(1), bits labeled M(2)[1:0] represent the sampled states m3(2) and m5(2), bits labeled M(3)[1:0] represent the sampled states m3(3) and m5(3), etc. The write enable signal 706 is activated once 8 bits of sampled states are available to be written to the memory. For example, the write enable signal is activated once sampled states M(0)[1:0], M(1)[1:0], M(2)[1:0], M(3)[1:0] have been accumulated by the reorder-and-shift circuit 224. Once a word having the 8 sampled states M(0)[1:0], M(1)[1:0], M(2)[1:0], M(3)[1:0] has been written to the memory at address 0, the write enable signal is deactivated until the next 8 sampled states have been accumulated and are ready to be written at address 1.

Figure 9:
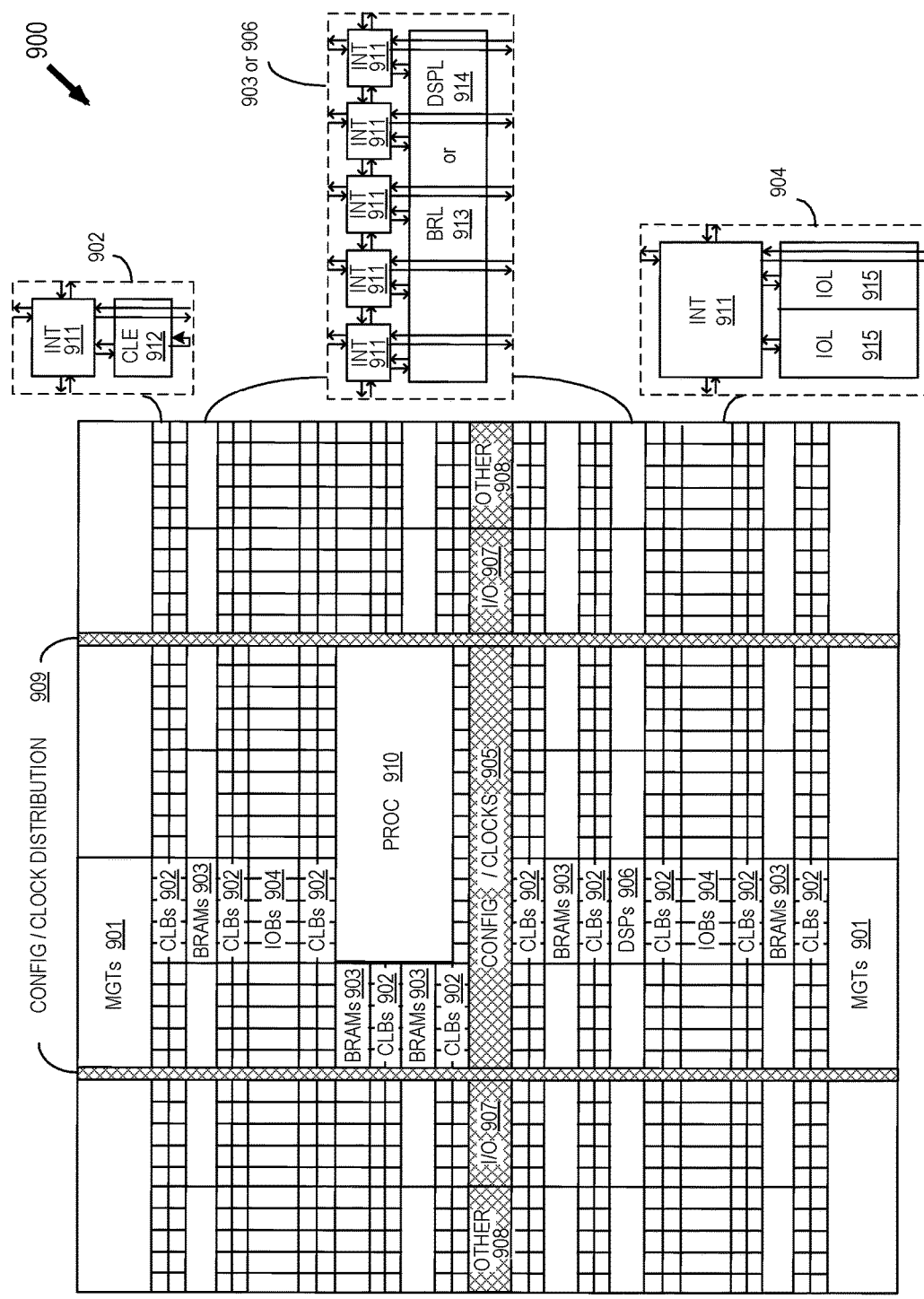
FIG. 9 shows a programmable integrated circuit (IC) on which the disclosed circuits and processes may be implemented.

FIG. 9 shows a programmable integrated circuit (IC) 900 on which the logic analyzer circuit and circuit-under-test may be implemented. The programmable IC may also be referred to as a System On Chip (SOC) that includes field programmable gate array logic (FPGA) along with other programmable resources. FPGA logic may include several different types of programmable logic blocks in the array. For example, FIG. 9 illustrates programmable IC 900 that includes a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/CLOCKS) 905, digital signal processing blocks (DSPs) 906, specialized input/output blocks (I/O) 907, for example, clock ports, and other programmable logic 908 such as digital clock managers, analog-to-digital converters, system monitoring logic, and so forth. Some programmable IC having FPGA logic also include dedicated processor blocks (PROC) 910 and internal and external reconfiguration ports (not shown).

In some FPGA logic, each programmable tile includes a programmable interconnect element (INT) 911 having standardized connections to and from a corresponding interconnect element in each adjacent tile. Therefore, the programmable interconnect elements taken together implement the programmable interconnect structure for the illustrated FPGA logic. The programmable interconnect element INT 911 also includes the connections to and from the programmable logic element within the same tile, as shown by the examples included at the top of FIG. 9.

For example, a CLB 902 can include a configurable logic element CLE 912 that can be programmed to implement user logic, plus a single programmable interconnect element INT 911. A BRAM 903 can include a BRAM logic element (BRL) 913 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 906 can include a DSP logic element (DSPL) 914 in addition to an appropriate number of programmable interconnect elements. An IOB 904 can include, for example, two instances of an input/output logic element (IOL) 915 in addition to one instance of the programmable interconnect element INT 911. As will be clear to those of skill in the art, the actual I/O bond pads connected, for example, to the I/O logic element 915, are manufactured using metal layered above the various illustrated logic blocks, and typically are not confined to the area of the input/output logic element 915.

In the pictured embodiment, a columnar area near the center of the die (shown shaded in FIG. 9) is used for configuration, clock, and other control logic. Horizontal areas 909 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 9 include additional logic blocks that disrupt the regular columnar structure making up a large part of the programmable IC. The additional logic blocks can be programmable blocks and/or dedicated logic. For example, the processor block PROC 910 shown in FIG. 9 spans several columns of CLBs and BRAMs.

Note that FIG. 9 is intended to illustrate only an exemplary programmable IC architecture. The number of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for debugging circuits. Other aspects and features will be apparent to those skilled in the art from consideration of the specification. It is intended that the specification and drawings be considered as examples only, with a true scope of the invention being indicated by the following claims.

What is claimed is:

1. A method of capturing states of signals of a circuit-under-test, comprising:
   generating a logic analyzer circuit coupled to the circuit-under-test within an integrated circuit, wherein the logic analyzer circuit is configured to receive a plurality of probe signals and a plurality of trigger signals from the circuit-under-test;
   inputting data identifying a subset of the probe signals and a subset of the trigger signals to the logic analyzer circuit;
   selecting, using a trigger signal selector circuit of the logic analyzer circuit, the subset of trigger signals for input to trigger logic in the logic analyzer circuit after the logic analyzer circuit and the circuit-under-test are active;
   selecting, using a probe signal selector circuit of the logic analyzer circuit, the subset of probe signals;
   sampling, using a data ordering circuit of the logic analyzer circuit, states of the subset of probe signals in response to the trigger logic; and
   accumulating a plurality of sampled states of the subset of probe signals in the data ordering circuit and, in response to a number of the accumulated plurality of sampled states reaching a predetermined number of sampled states, storing the accumulated sampled states of the subset of probe signals in a random-access memory.

2. The method of claim 1, further comprising:
   inputting to the logic analyzer circuit, data specifying a first sample depth;
   capturing a number of states of each probe signal of the subset of probe signals, wherein the first sample depth indicates, at least in part, the number of states of each probe signal;
   mapping the states of the subset of probe signals to respective locations in the random-access memory in response to cardinality of the subset of probe signals of the first plurality and the first sample depth; and
   wherein the storing includes storing the number of states of each probe signal of the subset of probe signals in the respective locations.

3. The method of claim 2, wherein the mapping includes:
   mapping states of the subset of probe signals and states of successively captured subsets to contiguous bit locations; and
   storing the states of the subset of probe signals and states of successively sampled subsets in the contiguous bit locations in the random-access memory.

4. The method of claim 2, further comprising at least one of:
   inputting data indicating another subset of probe signals and selecting the other subset of probe signals instead of the subset of probe signals; or
   inputting data indicating another subset of the trigger signals and selecting the other subset of the trigger signals instead of the subset of trigger signals for input to the trigger logic.

5. The method of claim 1, wherein the accumulating accumulates the plurality of sampled states over a plurality of clock cycles.

6. The method of claim 5, wherein the data ordering circuit assembles the accumulated sampled states into contiguous bits for storage in the random-access memory based upon word size of the random-access memory and which probe signals are selected as the subset of probe signals.

7. The method of claim 1, further comprising at least one of:
   inputting data indicating another subset of the probe signals and selecting the other subset of the probe signals instead of the subset of the probe signals; or
   inputting data indicating another subset of the trigger signals and selecting the other subset of the trigger signals instead of the subset of the trigger signals for input to the trigger logic.

8. The method of claim 1, further comprising generating a metadata file that maps names of the probe signals to identifiers of corresponding signals of the logic analyzer circuit.

9. The method of claim 8, wherein the inputting the data identifying the subset of probe signals and the subset of trigger signals includes:
   reading the metadata file;
   displaying the names of the probe signals and associated control elements for selection of the names of the probe signals;
   determining from the metadata file, in response to user selection of the control elements associated with names of the subset of probe signals, identifiers corresponding to the names of the subset of probe signals; and
   inputting to the logic analyzer circuit, identifiers corresponding to the names of the subset of probe signals.

10. The method of claim 8, wherein the metadata file specifies an interface level mapping of the probe signals that belong to an interface.

11. A method of capturing states of signals of a circuit, comprising:
    inputting to a processor, first data that identifies a first plurality and a second plurality of signals of a circuit description, wherein signals of the first plurality are selectable for probing and signals of the second plurality are selectable to be trigger signals;
    generating a first circuit from the circuit description and the first data;
    generating a second circuit from the first data and coupled to the first circuit, wherein the first circuit and the second circuit are implemented within an integrated circuit;
    inputting second data from a user interface to the second circuit, the second data indicating a first subset of signals of the first plurality to probe, specifying trigger logic, and indicating one or more signals of the second plurality of signals to be the trigger signals;
    activating the first and second circuits;
    selecting by the second circuit, the one or more signals of the second plurality for input to the trigger logic;
    selecting the first subset of signals of the first plurality by the second circuit;

sampling, using a data ordering circuit of the second circuit, states of the first subset of signals of the first plurality in response to the trigger logic; and accumulating, over a plurality of clock cycles, a plurality of sampled states of the subset of probe signals in the data ordering circuit and, in response to a number of the accumulated plurality of sampled states reaching a predetermined number of sampled states, storing the accumulated sampled states of the first subset of signals of the first plurality in a random-access memory.

12. A system for capturing states of signals of a circuit-under-test, comprising:
a processor configured to execute a debugger program, wherein execution of the debugger program causes the processor to input first data indicating a subset of probe signals to capture from the circuit-under-test and output a data selection signal indicative of the subset of probe signals;
a logic analyzer circuit coupled to the circuit-under-test and to the processor, the logic analyzer circuit including:
a first selector circuit coupled to input the probe signals from the circuit- under-test and to select the subset of probe signals in response to the data selection signal;
a trigger circuit coupled to receive trigger signals from the circuit-under- test and configured to enable sampling states of the subset of probe signals in response to the trigger signals;
a random-access memory configured to store sampled states of the subset of probe signals; and
a data ordering circuit coupled to the first selector circuit and configured to accumulate a plurality of sampled states of the subset of probe signals and, in response to a number of the accumulated plurality of sampled states reaching a predetermined number of sampled states, store the accumulated sampled states in the random-access memory.

13. The system of claim 12, wherein:
execution of the debugger program causes the processor to input second data that specify trigger logic and indicates a subset of the trigger signals, and to output a trigger selection signal;
the logic analyzer circuit further includes a second selector circuit, the second selector circuit configured and arranged to input the trigger signals and select the subset of trigger signals input to the trigger circuit in response to the trigger selection signal; and
the trigger circuit is configured and arranged to enable sampling states of the subset of probe signals in response to the specification of the trigger logic in the second data and states of the subset of trigger signals.

14. The system of claim 13, wherein:
execution of the debugger program causes the processor to input from a user interface to the logic analyzer circuit, third data indicating another subset of the trigger signals, and to output another trigger selection signal; and
the second selector circuit is configured and arranged to select the other subset of trigger signals instead of the subset of trigger signals for input to the trigger logic in response to the other trigger selection signal.

15. The system of claim 12, wherein:
execution of the debugger program causes the processor to input second data, the second data specifying a first sample depth, and output a depth signal indicative of the first sample depth;

the logic analyzer circuit further includes:
an address generation circuit coupled to the random-access memory and configured to map the subset of probe signals to respective locations in the random-access memory in response to cardinality of the subset of probe signals and the depth signal; and
wherein the data ordering circuit is coupled to receive the subset of probe signals and configured to:
capture a number of states of each signal of the subset of probe signals, the number indicated by the first sample depth; and
store the number of states of each signal of the subset of probe signals in the respective locations.

16. The system of claim 15, wherein:
execution of the debugger program causes the processor to input from a user interface to the logic analyzer circuit, fourth data identifying another subset of probe signals and specifying a second sample depth, and to output another data selection signal indicative of the other subset of probe signals and output another depth signal indicative of another sample depth;
the first selector circuit is configured and arranged to select the other subset of probe signals of the first plurality in response to the other data selection signal;
the data ordering circuit is further configured and arranged to capture a number of states of each signal of the other subset of probe signals, the number indicated by the other sample depth;
the address generation circuit is further configured and arranged to map states of the other subset of probe signals and states of successively sampled other subsets of probe signals to contiguous bit locations; and
the data ordering circuit is further configured to store the states of the other subset of probe signals and states of successively sampled other subsets of probe signals in the contiguous bit locations in the random-access memory.

17. The system of claim 12, wherein the data ordering circuit is configured to accumulate the plurality of sampled states over a plurality of clock cycles.

18. The system of claim 17, wherein the data ordering circuit assembles the accumulated sampled states into contiguous bits for storage in the random-access memory based upon word size of the random-access memory and which probe signals are selected as the subset of probe signals.

19. The system of claim 12, wherein:
execution of the debugger program further causes the processor to:
display individual control elements associated with the probe signals, respectively;
display a select-all control element and a deselect-all control element;
indicate selection of all of the probe signals in response to user selection of the select-all control element; and
indicate deselection of all of the probe signals in response to selection of the deselect-all control element.

20. The system of claim 12, wherein execution of the debugger program that causes the processor to input the first data, further causes the processor to:
read a metadata file that maps names of the signals of the first plurality to identifiers of corresponding signals of the logic analyzer circuit;
display the names of the probe signals and associated control elements for selection of the names of the probe signals;
determine from the metadata file, in response to user selection of the control elements associated with names of the probe signals, identifiers corresponding to the names of the subset of probe signals; and specify in the data selection signal, identifiers corresponding to the names of the subset of probe signals.

\* \* \* \* \*